US010553337B2

(12) United States Patent
 Ausserlechner

(10) Patent No.: US 10,553,337 B2
(45) Date of Patent: Feb. 4, 2020

(54) MAGNET ARRANGEMENT FOR POSITION SENSOR DEVICE AND CORRESPONDING POSITION SENSOR DEVICE

(71) Applicant: Infineon Technologies AG, Neubiberg (DE)

(72) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 83 days.

(21) Appl. No.: 14/935,636

(22) Filed: Nov. 9, 2015

(65) Prior Publication Data
 US 2016/0148731 A1    May 26, 2016

(30) Foreign Application Priority Data
 Nov. 24, 2014 (DE) .................... 20 2014 105 652 U

(51) Int. Cl.
 *G01D 5/12* (2006.01)
 *H01F 7/02* (2006.01)
(52) U.S. Cl.
 CPC ............... *H01F 7/021* (2013.01); *G01D 5/12* (2013.01)

(58) Field of Classification Search
 CPC ........... G01D 5/12; G01D 5/142; G01D 5/145
 See application file for complete search history.

(56) References Cited

U.S. PATENT DOCUMENTS

| 3,508,226 | A  | * | 4/1970  | Oberg      |             |
|-----------|----|---|---------|------------|-------------|
| 6,163,147 | A  | * | 12/2000 | Peilloud   | G01D 5/145  |
|           |    |   |         |            | 324/207.2   |
| 6,433,537 | B1 | * | 8/2002  | Petersen   | G01D 5/145  |
|           |    |   |         |            | 324/207.21  |
| 7,956,604 | B2 | * | 6/2011  | Ausserlechner | G01P 3/487 |
|           |    |   |         |            | 324/165     |
| 8,274,274 | B2 | * | 9/2012  | Burkhardt  | G01D 5/2457 |
|           |    |   |         |            | 324/207.11  |
| 2008/0297286 | A1 | * | 12/2008 | Yoshida | G01D 5/145  |
|           |    |   |         |            | 335/219     |
| 2011/0101964 | A1 | * | 5/2011  | Ausserlechner | G01D 5/145 |
|           |    |   |         |            | 324/207.11  |
| 2013/0043863 | A1 | * | 2/2013  | Ausserlechner | G01D 5/145 |
|           |    |   |         |            | 324/207.2   |

* cited by examiner

*Primary Examiner* — Walter L Lindsay, Jr.
*Assistant Examiner* — Milton Gonzalez
(74) *Attorney, Agent, or Firm* — Schiff Hardin LLP

(57) ABSTRACT

A magnet arrangement having at least one magnetic element providing a modulated magnetization in a first direction and an essentially constant magnetization in a second direction different from the first direction.

20 Claims, 5 Drawing Sheets

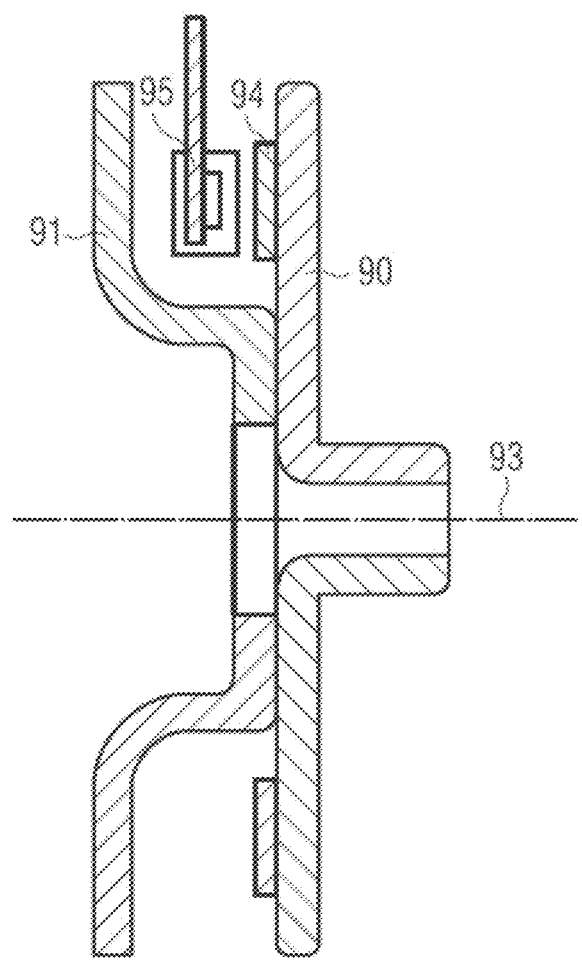

MAGNET ARRANGEMENT FOR POSITION SENSOR DEVICE AND CORRESPONDING POSITION SENSOR DEVICE

TECHNICAL FIELD

The present application relates to a magnet arrangement for a position sensor device and to a corresponding position sensor device using a magnet arrangement.

BACKGROUND

To sense a position, in some applications, one or more magnetic field sensors are used together with a magnet arrangement, the magnet arrangement moving relative to the at least one magnetic field sensor. For example, to determine an angular position, so-called pole wheels may be used, which when rotating cause a modulation of a local magnetic field, which is then sensed. Based on this modulation, a speed may be determined, and by integrating the speed, a position may be obtained. Similar arrangements may be used to detect linear movements.

As with such arrangement the local modulation is periodic, only a speed (for example rotational speed or linear speed) may be obtained directly, and a position (for example angular position or linear position) may be obtained only indirectly via integration of the speed.

However, in some applications, it may be desirable to be able to obtain a position directly.

It is therefore an object to provide magnet arrangement and position sensor devices which in some cases may enable a direct determination of position based for example on a sensed magnetic field.

SUMMARY

A magnet arrangement as defined in claim 1 and a position sensor device as defined in claim 17 are provided. The dependent claims define further embodiments.

BRIEF DESCRIPTION OF THE DRAWINGS

FIG. 9 illustrates a cross-sectional view of an angular position sensor device according to an embodiment.

DETAILED DESCRIPTION

In the following, various embodiments will be described in detail referring to the attached drawings. These embodiments are given by way of example only and are not to be construed as limiting. For example, while embodiments may be described as comprising a plurality of features or elements, in other embodiments some of these features or elements may be omitted and/or may be replaced by alternative features or elements. In yet other embodiments, additionally or alternatively additional features or elements apart from the ones explicitly described may be provided. Features or elements from different embodiments may be combined with each other to form further embodiments. For example, variations or modifications described with respect to one of the embodiments may also be applicable to other embodiments unless noted to the contrary.

Some embodiments use a magnetic field sensor moving relative to a magnet arrangement. "Moving relative" as used herein may indicate a movement of the magnetic field sensor, a movement of the magnet arrangement or both. A magnetic field sensor as used herein is not limited to any particular type of magnetic field sensor, but may be implemented in various manners, for example as a Hall sensor, for example a Hall plate or a vertical Hall sensor, or a magneto resistive sensor using one or more magneto resistive elements (for example using a giant magnetoresistive effect (GMR), an anisotropic magnetoresistive effect (AMR), a tunnel magnetoresistive effect (TMR) or a colossal magnetoresistive effect (CMR). Magnetoresistive elements may for example be provided in a full-bridge or half-bridge configuration to implement a magnetic field sensor. Other conventional implementations of magnetic field sensor may be used as well. A magnetic field sensor may comprise one or more sensor elements, e.g. to sense field components in one or more directions.

A magnet arrangement refers to a device or element generating a magnetic field. Such a magnet arrangement may use one or more permanent magnets and/or one or more electromagnets to generate the magnetic field.

Figure 1:
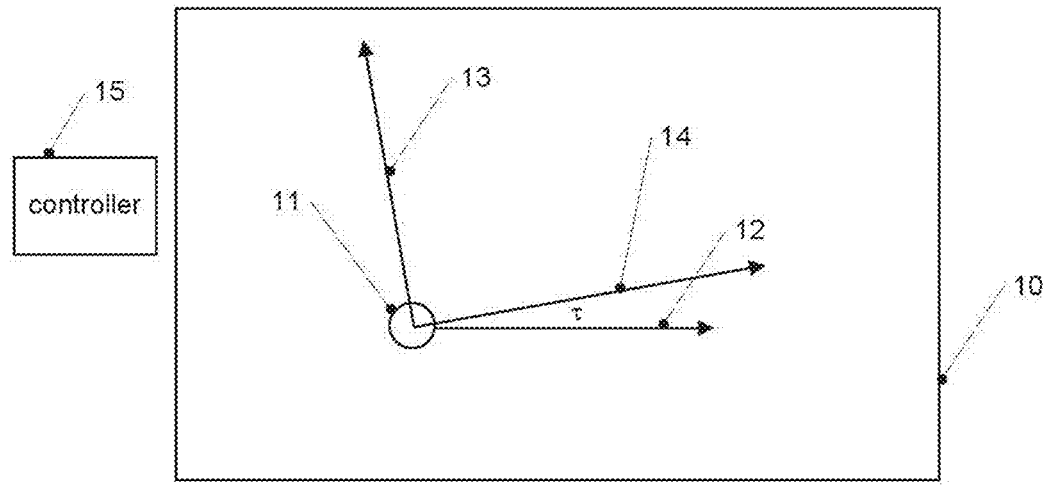
FIG. 1 is a schematic view of a position sensor device according to an embodiment.

Turning now to the figures, FIG. 1 illustrates a schematic representation of a position sensor device according to an embodiment. The position sensor device of FIG. 1 comprises a magnet arrangement 10 and a magnetic field sensor 11. Magnetic field sensor 11 may move relative to magnet arrangement 10 in a direction 12 (represented by an arrow in FIG. 1). While direction 12 in FIG. 1 is represented as a straight linear movement direction, in other embodiments, other movement directions are possible, for example a circular movement in case of an angular position sensor device, or any other movement. In embodiments, the movement may be a movement along a predetermined movement path, for example the linear movement direction 12 shown in FIG. 1 or a circular movement direction. To perform the relative movement, magnetic field sensor 11, magnet arrangement 10 or both may move.

Magnet arrangement 10 may comprise one or more magnetic elements and is configured to provide a modulated field in a first direction 13, while the magnetic field provided by magnet arrangement 10 is essentially constant in a second direction 14. "Essentially constant" may imply that e.g. over a range of movement of interest, the magnetic field does not vary by more than 5%, more than 10% or more than 20%. On the other hand, in first direction 13, a change of magnetic field may be significantly greater. In embodiments, the modulation in the first direction 13 may be a periodic modulation or an essentially periodic modulation, but is not limited thereto. In the embodiment of FIG. 1, where the direction 12 (movement direction) is linear, first direction 13 and second direction 14 may be two linear directions perpendicular to each other.

In the embodiment of FIG. 1, direction 12 is a direction closer to second direction 14 than to first direction 13. For example, an angle τ between movement direction 12 and second direction 14 in which the magnetic field is essentially constant may be less than 15°, e.g. less than 10°, but is not limited thereto. In embodiments, by such a choice when moving along movement direction 12 magnetic field sensor 11 experiences a slower modulation of the magnetic field sensed compared to a modulation along first direction 13. In some embodiments, this may be used for position determination as for example a bijective relationship between magnetic field sensed by sensor 11 and position of sensor 11 within a certain movement range may be given.

The signal of magnetic field sensor 11 may then be evaluated by a controller 15. For example, in embodiments based on the magnetic field sensed by sensor 11 controller 15 may determine the position of magnetic field sensor 11 relative to magnet arrangement 10.

It should be noted that in embodiments where movement direction 12 is not a straight direction (for example is a circumferential direction for angular position detection), second duet 14 and first direction 13 may also be non-straight directions. For example, in such embodiments second direction 14 may be close to the circumferential direction, and first direction 13 may be close to a radial direction.

The general techniques and principle illustrated above with respect to FIG. 1 serve only as a brief overview over some concepts applicable in some embodiments. More specific examples will be described next with reference to FIGS. 2-9.

Figure 2:
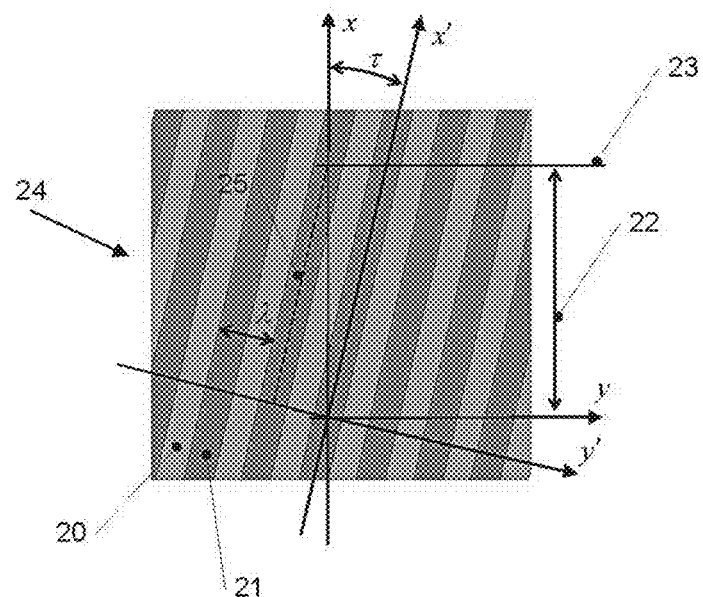
FIG. 2 illustrates a magnet arrangement according to an embodiment.

FIG. 2 illustrates a magnet arrangement 24 according to an embodiment.

Magnet arrangement 24 comprises alternating magnetic stripes 20, 21 with different magnetizations. In a direction labelled y', which is an example for the first direction of FIG. 1, this results in a modulation of the magnetic field with a period λ. In a direction perpendicular to direction y' (labelled x') in FIG. 2, the magnetic field is essentially constant (for example with a variation less than 5%, less than 10% or less than 20% in a movement range of interest explained later) within a certain area determined e.g. by a size of the magnet arrangement 24. In a direction perpendicular to x' and y' (z-direction) the magnetic field generated by magnet arrangement 24 in embodiments decreases. Magnetic stripes 20, 21 may for example comprise magnets of different strength, different orientations etc. Examples for magnetizations of magnetic stripes 20, 21 will be given later with respect to FIGS. 3A-3D. Magnetic stripes 20 and 21 may for example be permanent magnets, for example plastic-bound permanent magnets, which may have a thickness of the order of 2 Millimetres and may be mounted to a carrier. In some embodiments, the mounting may be made using glue or other adhesives. In an embodiment, the carrier may comprise a magnetically soft material, for example magnetically soft sheet steel. Such a material in embodiments may amplify the magnetic fields generated by magnet arrangement 24 on a side opposite to where magnetic stripes 20, 21 are mounted to the carriers. In other embodiments, other carriers may be used. In yet other embodiments, instead of permanent magnets electromagnets may be used.

Before explaining position determination and movement of a magnetic field sensor relative to magnet arrangement 24 of FIG. 2 in some more detail, first with reference to FIGS. 3A-3D and FIG. 4 some example configuration for magnetic stripes 20, 21 will be discussed.

Figure 3A:
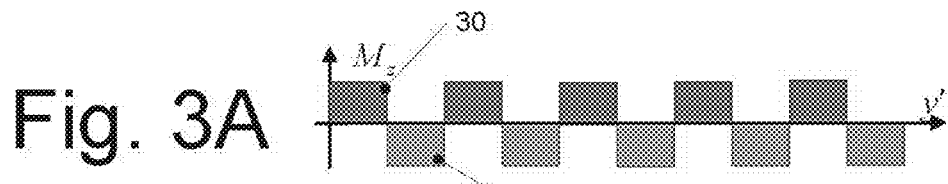
FIGS. 3A-3D illustrate various implementation possibilities of the magnet arrangement of FIG. 2.

In FIGS. 3A-3D, $M_z$ indicates a magnetization in the z-direction (perpendicular to x', y' of FIG. 2), and this magnetization is shown over the y'-direction of FIG. 2, i.e. $M_z$ (y'). In FIG. 3A, as indicated by 30, stripes 20 may have a magnetization in the positive z-direction, and stripes 21 may have a magnetization as indicated by 31 in the negative z-direction, of approximately the same magnitude as stripes 20.

Figure 3B:
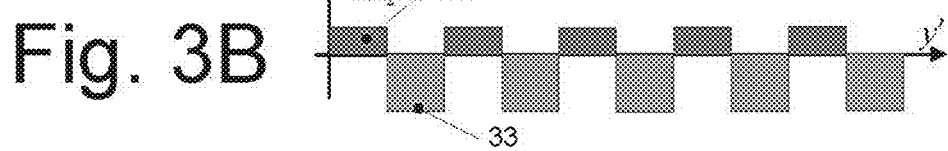

In FIG. 3B, as indicated by 32 and 33, the magnetization of magnetic stripes 20 is in the positive direction, while the magnetization of stripes 21 is in the negative z-direction and has a different magnitude compared to the magnetization of stripes 20 (in the example of FIG. 3B a greater magnitude, although in other examples it may also be a smaller magnitude).

Figure 3C:
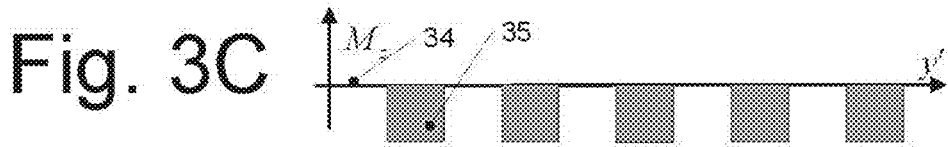

In the example of FIG. 3C, as indicated by 34 magnetic stripes 20 may essentially be omitted (i.e. no magnetization), whereas stripes 35 have a magnetization in the negative z-direction. In other embodiments, stripes 35 may have a magnetization in the positive z-direction.

Figure 3D:
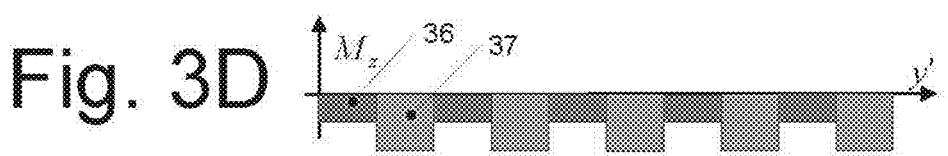

In the example of FIG. 3D, magnetic stripes 20, as indicated by 36, and magnetic stripes 21, as indicated by 37, both have a magnetization in the negative z-direction, wherein the magnitudes of the magnetizations of stripes 20, 21 differ from each other. In other embodiments, both magnetizations may be in the positive z-direction. While in FIG. 3 the magnitude of magnetization of stripes 21 is higher than of magnetic stripes 20, in other embodiments this may be the other way round.

FIGS. 3A-3D are merely some examples showing that different approaches exist to providing a periodic modulation to the magnetization and therefore to the magnetic field generated in y'-direction.

Figure 4:
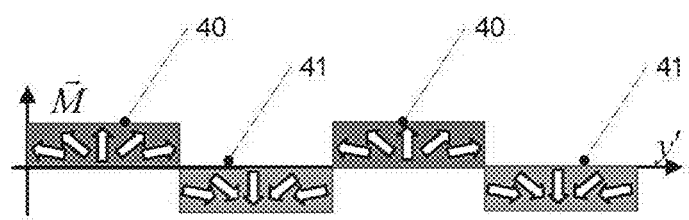
FIG. 4 illustrates an implementation example of a magnet arrangement according to some embodiments.

In other embodiments, the magnetization change between magnetic stripes 20, 21 may be gradual. An example for such a gradual change is shown in FIG. 4. Here, areas 40 may correspond to magnetic stripes 20, and areas 41 may correspond to magnetic stripes 21. The arrows illustrate the behavior of a magnetization vector $\vec{M}$ varying along the y'-axis. As can be seen, here the magnetization changes gradually in a periodic manner. In some embodiments, the change of $\vec{M}$ may be such that $M_z$ has a sinusoidal periodic behavior in y'-direction.

As can be seen from FIGS. 3A-3D and 4, a plurality of possibilities exist in various embodiments to provide a magnetic field modulated in the y'-direction. It should be noted that the examples of FIGS. 3A-3B and 4 are not exhaustive, and constitute merely some possible examples.

Returning now to FIG. 2, magnet arrangement 24 may for example be used for a linear position sensor, where a magnetic field sensor moves relative to magnet arrangement 24 in an x-direction between a y-axis and a line 23. In other words, a range of travel for the magnetic field sensor along the x-direction is given by an arrow 22 in FIG. 2.

In embodiments, magnet arrangement 24 in the x-direction covers the complete range of travel 22 and in particular may extend beyond the range of travel 22 (in positive x-direction, negative x-direction or both). In a direction perpendicular to the direction of travel (y-direction of FIG. 2), magnet arrangement 24 may also extend considerably, for example have a similar extension as in the x'-direction, but may also be more limited in other embodiments. Generally, a larger extension may lead to a more exact and/or uniform periodicity and/or reproducible behavior of the magnetic field over the range of travel of a magnetic field sensor, but may also require a larger magnet and more space, which may increase costs. Therefore, in embodiments, a balance has to be made between a required accuracy and costs and size considerations.

To explain position determination using a magnet arrangement like magnet arrangement 24 more clearly, for illustration purposes it is first assumed that magnet arrangement 24 extends essentially to infinity in positive and negative x-direction as well as positive and negative y-direction. Under this assumption, a magnetic field generated by magnet arrangement 24 of FIG. 2 has the following properties:

It is periodic with a period length λ in y'-direction, and it is essentially constant in x'-direction.

Furthermore, in embodiments as explained a sensor moves in the x-direction, which forms an angle τ with the x-direction. τ may be less than 20°, for example less than 10°, for example about 6°. Other angles τ are also possible.

If a magnetic field sensor moved in the x'-direction, the sensor would sense essentially no change in the magnetic field. If the sensor moved in the y'-direction, the sensor would sense a periodic magnetic field with a period length A. In embodiments, when a distance of the sensor from magnet arrangement 24 is not too small, for example at least λ/2 and this distance (in the z-direction) is constant, the modulation may be essentially sinusoidal.

In embodiments, using the magnet arrangement of FIG. 2 the amplitudes of Bz (magnetic field in z-direction) and By' (magnetic field in y'-direction) are essentially identical, this identity increasing with increasing z coordinate. Furthermore, Bz and By' with a magnet arrangement as shown in FIG. 2 have essentially a phase shift of 90° to each other. For example, one of Bz and By' in the y'-direction may be proportional to to $\cos(2 \cdot \pi \cdot y'/\lambda)$, and the other one of Bz and By' may be proportional to $\sin(2 \cdot \pi \cdot y'/\lambda)$. This 90° phase shift and the at least approximately correspondence of the amplitudes of Bz and By' lead to the following two properties:

(1) $By'^2 + Bz^2 = \text{const}_x$, i.e. the sum of the squares of the values of the two field components By' and Bz are independent from the position in x-direction, and (2) $By'/Bz' = \text{const}_{z,th}$, i.e. the ratio of the values of the two field components By', Bz' is independent from the position z of the magnetic field sensor (for example an air gap between sensor and magnet arrangement 24) and independent from a thickness th of the magnet arrangement (like magnetic stripes 20, 21). This thickness th in embodiments may be homogenous.

A magnetic field sensor like magnetic field sensor 11 of FIG. 1 in an embodiment may for example sense Bz and By', for example using two sensor elements, one for each magnetic field component Bz and By'. In this respect, it is to be noted that many conventional sensor techniques like Hall sensors or magnetoresistive sensors are sensitive to a particular magnetic field direction.

To determine a x-coordinate of the sensor, for example within the range of travel 22, a ratio between Bz and By' (i.e. By'/Bz or Bz/By') may be formed. Based on this ratio, y' may be calculated, for example as arctan (By'/Bz), arctan being the arc tangent function.

In some embodiments, the angle τ is chosen such that over the range of travel in x-direction (for example range of travel 22) the sensor moves only over one period λ in the y'-direction, as indicated by a line 25 in FIG. 2. Therefore, in such embodiment, the y'-position may be unambiguously determined for each x-position within the range of travel 22. Furthermore, the y'-position has a fixed relationship with the x-position over the range of travel 22, such that in this way the position of the magnetic field sensor can be determined (via the angle τ).

It should be noted by that essentially by choosing the angle τ accordingly, the range of travel 22 is increased compared to the period λ, while the sensor still in the y'-direction travels only one period λ, which allows an unambiguous determination of the position in some embodiments.

When determining the x-position in this way because of (2) above x is essentially independent from the z-position of the sensor device. Therefore, the method is robust against variations of z in some embodiments.

In other embodiments, instead of absolute values Bz, By' a magnetic field sensor may sense gradients thereof in the y'-direction, i.e. dBz/dy' and dBy'/dy'. The properties (1) and (2) mentioned above also apply to the gradients. This may be easily seen from the fact that when for example Bz is proportional to $\cos(2 \cdot \pi \cdot y'/\lambda)$, dBz/dy' is proportional to $\sin(2 \cdot \pi \cdot y'/\lambda)$, and corresponding relationships also apply to By' and dBy'/dy', i.e. by using the gradients the sine and cosine term are essentially exchanged. Therefore, the techniques discussed above may also be implemented using the gradients. In some embodiments, using the gradients has the advantage that they are robust against homogenous disturbance magnetic fields (as the gradient of a homogenous field is 0 and therefore does not contribute).

It should be noted that the amplitude of the magnetic fields Bz and By' decreases exponentially with a distance from magnet arrangement 24, for example proportional to $\exp(-2 \cdot \pi \cdot z/\lambda)$, wherein z=0 may be at the side of magnetic stripes 20, 21 facing away from the magnet sensor (for example at an interface between magnetic stripes and carrier). Therefore, to obtain large magnetic fields to be measured, a small value of z may be used. On the other hand, a certain distance between sensor and magnet arrangement may be required due to mechanical constraints, e.g. to prevent contacts between sensor and magnet arrangement which may even lead to damaging. In some embodiments, a z-position of the sensor is selected to be smaller than 2·λ. In some embodiments, for designing magnet arrangement 24, a minimum and a maximum value for the z-position of the sensor may be determined based on constraints regarding the design and constraints regarding the magnetic field needed for an accurate sensing, and then λ may be selected (i.e. a width of magnetic stripes 20, 21 in the embodiment of FIG. 2 may be selected). τ may then be determined based on a required range of travel 22 and the selected λ.

As already mentioned, the magnetic field in the embodiment of FIG. 2 is periodic in y'-direction. In embodiments, the magnetization of the magnetic stripes 20, 21 may be sinusoidal (for example as illustrated with respect to FIG. 4), which may lead to the magnetic field being sinusoidal also for small values of z. In other embodiments, other magnetizations, for example rectangular modulations as illustrated in FIGS. 3A-3C or triangular shaped magnetizations may be used. For a rectangular magnetization in some embodiments a larger distance z (for example exceeding λ/2) may be used to have an approximately sinusoidal behavior of the magnetic fields By' and Bz. For smaller distances, Bz may have an approximately rectangular shape and By' may have a triangular dependency on y', which may make determination of an exact position more difficult for small distances z. Other magnetizations may also be used.

In the above explanations it has been assumed that the magnet arrangement 24 has a large extension in the y'-direction, which leads to a regular periodic dependency of the magnetic field in y'-direction (for example sinusoidal dependency or approximately sinusoidal dependency). In practical cases, as mentioned previously, it may be desirable to limit the extension in y'-direction due to area or cost constraints. With the regular stripes 20, 21 of FIG. 2, such a limitation would lead to an increase of the amplitude of the magnetic field and a variation of the periodicity closer to the edges (left and right edges in FIG. 2) of magnet arrangement 24. The behavior of the magnetic fields in this case is still similar to the sine or cosine curve, but the amplitude increases with decreasing distance to the edges, and the period of the modulation increases. This effect is also known as "windowing". To compensate this, in embodiments the period λ of the magnetic stripes (e.g. width of stripes) may be decreased closer to the edges.

Figure 5:
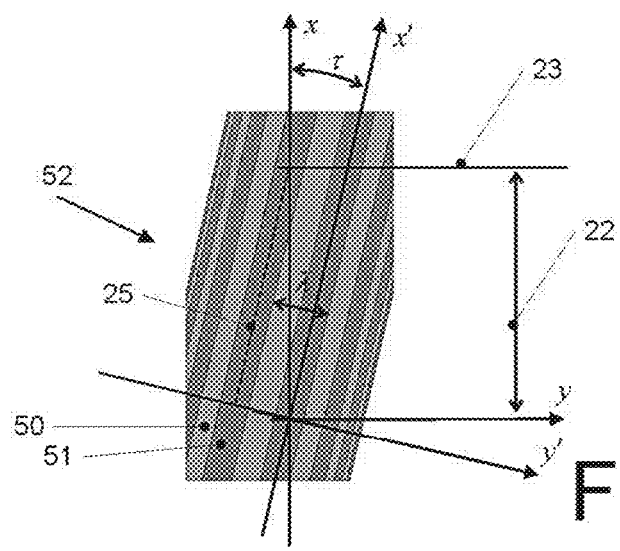
FIG. 5 illustrates a magnet arrangement according to some embodiments.

A corresponding embodiment of a magnet arrangement 52 is illustrated in FIG. 5. Here, a width of stripes 50, 51 and therefore the period of the stripes decreases in the positive and negative y'-direction starting from a period length λ shown in FIG. 5. Through such a decrease, the above-mentioned windowing effect may be at least partially compensated. It should be noted that compensation of the "windowing" effect in embodiments only needs to be applied for the desired range of travel 22, i.e. the desired behavior of the magnetic field in embodiments has to be present at locations where a magnetic field sensor may sense the magnetic field over the range of travel 22.

Apart from the varying width of the magnetic stripes, the embodiment of FIG. 5 corresponds to the embodiment of FIG. 2, and like elements bear the same reference numerals. Modifications and variations discussed for the embodiment of FIG. 2, for example as discussed with references 3A to 3D and 4, may also be applied to the embodiment of FIG. 5, with only the width of stripes 50, 51 changing as explained above. It should be noted that FIG. 5 also illustrates that a magnet arrangement to the embodiment need not have a rectangular shape as shown in FIG. 2 for magnet arrangement 24, but may also have a different shape, a hexagon shape as shown for magnet arrangement 52 of FIG. 5.

Figure 6:
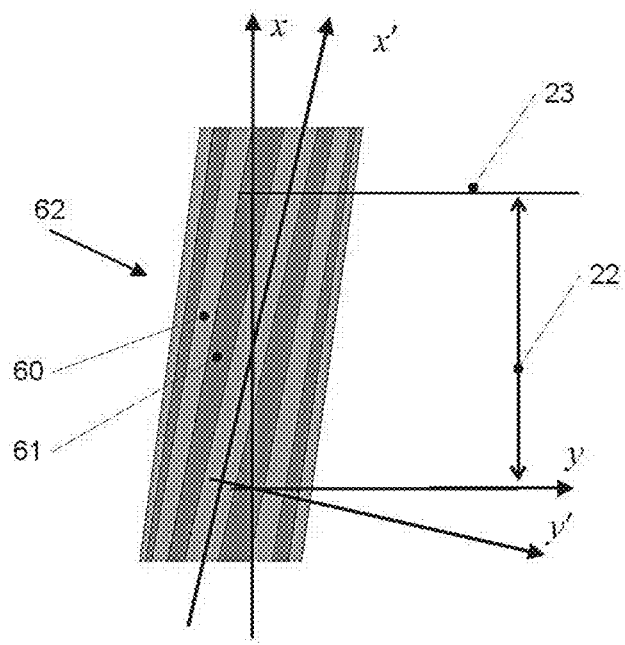
FIG. 6 illustrates a magnet arrangement according to further embodiments.

In further embodiments, a width of each or some of the magnetic stripes additionally or alternatively may vary in the x'-direction. An embodiment of a corresponding magnet arrangement 62 is illustrated in FIG. 6. Here, the width of stripes 60, 61 on the one hand decreases in the positive and negative y'-direction from one stripe to the next, as in FIG. 5, and additionally varies monotonously in the x'-direction within each stripe. In some embodiments, this may further serve to limit the windowing effect, and in particular may limit an influence of a limited size of magnet arrangement 62 on the sinusoidal shape of the magnetic field components By', Bz.

Apart from the discussed varying width of magnetic stripes 60, 61, magnet arrangement 62 of FIG. 6 may be implemented as discussed previously for magnet arrangement 24 or 52, including variations and modifications discussed.

The magnet arrangements discussed previously are in particular suitable for implementing a linear position sensor device. Such a sensor device may for example be implemented as explained with reference to FIG. 1 using a magnetic field sensor like magnetic field sensor 11. As already mentioned with respect to FIG. 1, in other embodiments rotational position sensors, for example angular sensors sensing an angular position, may be used. For implementing a rotational sensor, essentially the linear travel path 22 may be "wound" about the centre of rotation, such that the path (for example travel range 22 discussed previously) forms e.g. a closed circle. In embodiments where it is not necessary to sense a full circular movement (for example when only a certain angular range is of interest), the circle may be opened. A first possibility to achieve this is to provide the magnetic stripes on a cylinder barrel of a cylinder rotating about an axis relative to a magnetic field sensor. A second possibility is to provide the magnet arrangement on a plane in a circular manner. The directions like x, y, x', y' mentioned in FIGS. 2, 5 and 6 change accordingly and in particular are not necessarily straight directions.

With the second possibility mentioned above, a spiral shape of the magnet arrangement results. An infinite extension of the magnet arrangement of a linear sensor as discussed with reference to FIG. 2 then would result in an internal diameter of the spiral of 0 and an external diameter of approximating infinity. Values between 0 and infinity for internal and external diameter correspond to a limited extension of the magnet arrangement in y (or y')-direction for a linear sensor as discussed with reference FIGS. 2, 5 and 6.

Figure 7:
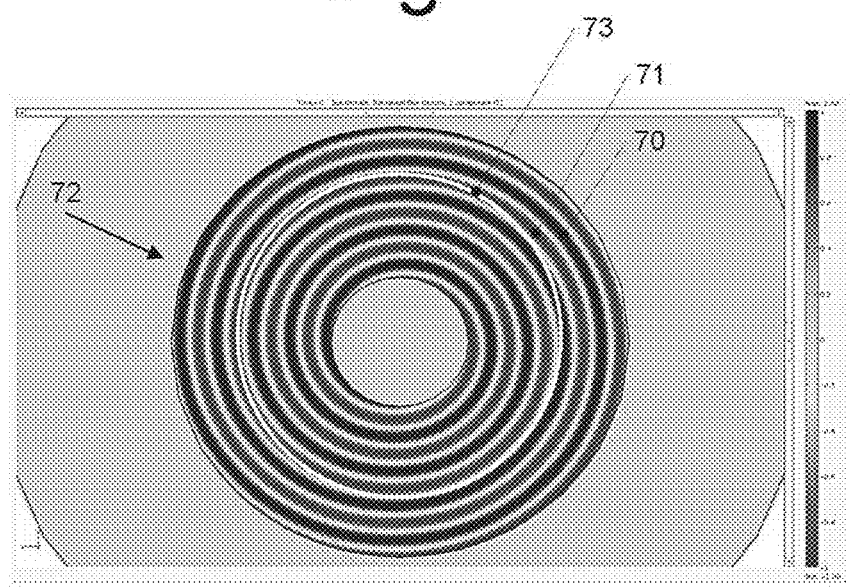
FIG. 7 illustrates a magnet arrangement for an angular position sensor device according to an embodiment.

An example for a corresponding magnet arrangement 72 according to an embodiment is illustrated in FIGS. 7. 70 and 71 correspond to alternating magnetic stripes which are wound in a spiral, and 73 illustrates an example path of a magnetic field sensor travel range relative to magnet arrangement 72. In the example of FIG. 7, the spiral shape is such that the pattern formed by stripes 70, 71 moves "inward" by one period λ with a rotation of 360° of the spiral.

For example, the x-direction of FIGS. 2, 5 and 6 may now correspond to a circumferential direction (for example direction along path of travel 73), and the y-direction may correspond to a radial direction (from a centre of rotation towards the outside). x'- and y'-directions are offset therefrom by a respective angle corresponding to the above-described angle τ.

Compared to the linear case described previously, the curvature of the magnetic stripes 70, 71 may to some extent introduce distortions, i.e. for example deviations from a sinusoidal periodic shape of the relevant magnetic fields depending on angular position. In some embodiments this may be mitigated by reducing the width of stripes 70, 71 towards the outside of the spiral shape shown.

It should be noted that the spiral shape shown may be left-handed or right-handed.

Figure 8:
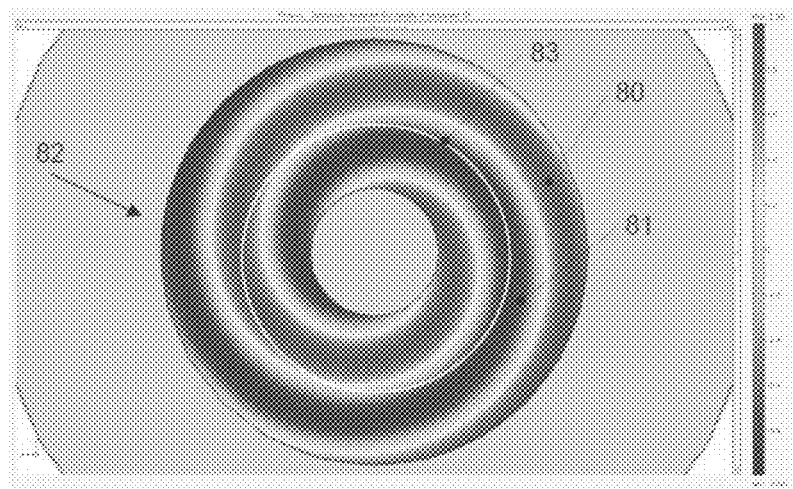
FIG. 8 illustrates a magnet arrangement for an angular position sensor device according to a further embodiment.

It should also be noted that the widths of magnetic stripes 70, 71 may differ from the widths illustrated in the embodiment of FIG. 7. As an example, FIG. 8 illustrates a magnet arrangement 82 where magnetic stripes 80, 81 have a greater width than shown in FIG. 7, and a corresponding spiral makes little more than one turn. 83 denotes a possible path of a magnetic field sensor relative to magnet arrangement 82. In some cases, a decrease of field strength in the z-direction (perpendicular to the plane shown in FIGS. 7 and 8) may be lower in case of FIG. 8 than in case of FIG. 7. As can be seen in FIG. 8, a width of stripes 80, 81 may decrease towards an outside of the spiral and towards an inside of the spiral in some embodiments.

In such angular position sensors using for example magnet arrangement as illustrated in FIGS. 7 and 8, tolerances or clearances of the rotational axis may lead to a change of a distance between a magnetic field sensor and a magnet arrangement, for example to a change of an air gap (change of the z-position of the sensor). Similar to what has been explained above for the linear case, measurements may be robust against variations of the z-positions by measuring two magnet field components and using a ratio between the components for determination of the position.

In some embodiments, a radial component BR (i.e. a component in a radial direction, e.g. from a center of rotation outwards) could be used together with Bz, which would correspond to using By and Bz in the linear case. As explained above, in some embodiments in the linear case By' (and not By) and Bz are used, which may have advantages in certain circumstances.

Therefore, in the angular position sensor case for example of FIGS. 7 and 8, a component corresponding to By' in the linear case may be used, which corresponds to a component largely corresponding to the radial component BR (i.e. direction from the centre of rotation towards the outside), but also has a small component of a circumferential field Bψ (field in the circumferential direction, for example a direction along path 83). R and ψ may for example indicate the polar coordinates in the plane of FIG. 8, the z-direction being perpendicular thereto and R being the radial coordinate an ψ the angular coordinate.

In some embodiments, a magnetic field sensor senses a magnet field in one direction in the (R-, ψ)-plane (plane shown for example in FIGS. 7 and 8) and a magnetic field perpendicular thereto (Bz), i.e. perpendicular to the (R-, ψ-)plane and from this calculates an angular position, for example rotational angle of the magnet arrangement or rotation angle of the magnetic field sensor. In some embodiments, a magnetic field sensor may comprise respective sensor elements which are sensitive to a respective desired magnetic field direction in the (R, ψ)-plane, for example a vertical Hall sensor with a certain orientation parallel to a chip edge, wherein the respective chip or package is arranged at an angle to the magnet arrangement to provide a desired orientation.

In some embodiments, the magnetic field sensor, for example implemented as a sensor chip, may comprise a plurality of sensor elements which sense magnetic fields in two directions in the (R, ψ)-planes, the two directions linear independent from each other (i.e. being different by an angle which differs from an integer multiple of 180°). When two such directions are sensed, any desired direction in the (R, ψ)-plane may be calculated based on a linear combination. In such a case, any desired orientation of a sensor chip could be used as long as two linear independent directions in the (R, ψ)-plane may be sensed. It should be noted that this also applies to the linear case, where by two linear independent measurements in the x-y-plane (corresponding to the x'-y'-plane) a magnetic field in any desired direction in this plane, for example in the y'-direction (By') may be calculated.

FIG. 9 illustrates a cross-sectional view of a angular position sensor device where magnet arrangements as discussed with reference to FIGS. 7 and 8 or other similar magnet arrangement may be used. The embodiment of FIG. 9 is only one example for such a suitable position sensor device, and other implementations are also possible.

In the embodiment of FIG. 9, two elements 90, 91 are provided forming a gap in which a magnetic field sensor 95 is positioned. In embodiments, elements 90, 91 may be made of a magnetically soft material, for example magnetically soft steel. A relative permeability $\mu_R$ of such a magnetically soft material may be greater than 300, for example greater than 1700 or greater than 4000. Element 90 in the embodiment of FIG. 9 carries a magnet arrangement 94, for example a spiral-shaped arrangement as illustrated and explained with respect to FIG. 7 or 8. In the embodiment of FIG. 9, element 90 may for example rotate about an axis 93, and the device of FIG. 9 serves to provide an angular position of element 90 and therefore a rotation angle of axis 93. In other embodiments, magnet arrangement 94 may be provided on a further element. Element 91 may rotate together with element 90 or may be stationary. Elements 90, 91 in embodiments may shield magnetic field sensor 95 from external magnetic fields. In embodiments, the distance between elements 91, 90 at the position of sensor 95 may be such a magnet field generated by magnet arrangement 94 is comparatively weak at element 91, such that element 91 does not significantly influence the magnetic field generated by magnet arrangement 94.

The above-described embodiments serve merely as examples, and in other embodiments other configurations may be used.

The invention claimed is:

1. A position sensor device, comprising:
a magnet arrangement, comprising: at least one magnetic element providing a modulated magnetization in a first direction and an essentially constant magnetization in a second direction different from the first direction, wherein transition lines of the magnetization in the first direction are formed to be linear and parallel with one another in the second direction; and
a magnet field sensor movable relative to the magnet arrangement,
wherein a movement direction of the magnetic field sensor forms an angle smaller than 15° with the second direction.

2. The magnet arrangement of claim 1, wherein the second direction is essentially perpendicular to the first direction.

3. The magnet arrangement of claim 1, wherein the at least one magnetic element comprises at least two magnetic stripes with different magnetizations.

4. The magnet arrangement of claim 1, wherein the first and second directions are straight directions.

5. The magnet arrangement of claim 4, wherein the at least one magnetic element comprises a plurality of first magnetic stripes having a first magnetization and second magnetic stripes having a second magnetization different from the first magnetization, the first and second stripes extending in the first direction and being provided adjacent to each other in an alternating manner, alternating between first and second stripes in the second direction.

6. The magnet arrangement of claim 5, wherein a magnetization direction of the first stripes differs from a magnetization direction of the second stripes.

7. The magnet arrangement of claim 1, wherein the at least one magnetic element is provided on a magnetically soft carrier.

8. The device of claim 1, wherein the direction of a relative movement of the magnetic field sensor is a linear direction.

9. The device of claim 1, wherein the magnetic field sensor is adapted to measure a first magnetic field in the first direction and a second magnetic field in a direction perpendicular to the first and second directions.

10. The device of claim 1, wherein the magnetic field sensor is adapted to measure a gradient in the first direction of the magnetic field in the first direction and a gradient in the first direction of a magnetic field in a direction perpendicular to the first and second directions.

11. A position sensor device, comprising:
a magnet arrangement, comprising: at least one magnetic element providing a modulated magnetization in a first direction and an essentially constant magnetization in a second direction different from the first direction, wherein transition lines of the magnetization in the first direction are formed to be linear and parallel with one another in the second direction; and
a magnet field sensor movable relative to the magnet arrangement, wherein a relative movement of the magnetic field sensor is such that a maximum range of movement covers one period or less in the first direction of the magnet arrangement.

12. The magnet arrangement of claim 11, wherein the second direction is essentially perpendicular to the first direction.

13. The magnet arrangement of claim 11, wherein the at least one magnetic element comprises at least two magnetic stripes with different magnetizations.

14. The magnet arrangement of claim 11, wherein the first and second directions are straight directions.

15. The magnet arrangement of claim 14, wherein the at least one magnetic element comprises a plurality of first magnetic stripes having a first magnetization and second magnetic stripes having a second magnetization different from the first magnetization, the first and second stripes extending in the first direction and being provided adjacent to each other in an alternating manner, alternating between first and second stripes in the second direction.

16. The magnet arrangement of claim 15, wherein a magnetization direction of the first stripes differs from a magnetization direction of the second stripes.

17. The magnet arrangement of claim 11, wherein the at least one magnetic element is provided on a magnetically soft carrier.

18. The device of claim 11, wherein the direction of a relative movement of the magnetic field sensor is a linear direction.

19. The device of claim 11, wherein the magnetic field sensor is adapted to measure a first magnetic field in the first direction and a second magnetic field in a direction perpendicular to the first and second directions.

20. The device of claim 11, wherein the magnetic field sensor is adapted to measure a gradient in the first direction of the magnetic field in the first direction and a gradient in the first direction of a magnetic field in a direction perpendicular to the first and second directions.

* * * * *